United States Patent [19]
Fleeman

[11] Patent Number: 5,652,537
[45] Date of Patent: Jul. 29, 1997

[54] IMPEDANCE MULTIPLIER

[75] Inventor: Stephen R. Fleeman, Rockford, Ill.

[73] Assignee: Sundstrand Corporation, Rockford, Ill.

[21] Appl. No.: 552,647

[22] Filed: Nov. 3, 1995

[51] Int. Cl.$^6$ .................... G06F 7/44; H03B 1/00
[52] U.S. Cl. .................. 327/358; 327/356; 327/363; 327/553
[58] Field of Search .................... 327/334, 356, 327/358, 359, 360, 363, 552, 553, 344, 345, 336, 306; 330/303, 85; 333/213, 214

[56] References Cited

U.S. PATENT DOCUMENTS

| | | | |
|---|---|---|---|
| 3,750,044 | 7/1973 | Stanley | 330/107 |
| 3,831,117 | 8/1974 | Fletcher et al. | 330/302 |
| 3,940,709 | 2/1976 | Heaslett | 330/51 |
| 3,946,279 | 3/1976 | Paice et al. | 317/18 C |
| 3,986,127 | 10/1976 | Ray | 327/344 |
| 4,517,508 | 5/1985 | Sakai | 323/352 |
| 5,001,441 | 3/1991 | Gen-Kuong | 330/107 |
| 5,124,586 | 6/1992 | Carobolante | 307/490 |
| 5,339,285 | 8/1994 | Straw | 330/258 |

OTHER PUBLICATIONS

Stephen R. Fleeman, *Electronic Devices Discrete and Integrated*, Prentice Hall, Inc. 1990, pp. 504–508 and pp. 841–846.

*Primary Examiner*—Toan Tran
*Attorney, Agent, or Firm*—Jeffery J. Makeever

[57] ABSTRACT

An impedance multiplier circuit comprises an input impedance having a certain value of impedance and a circuit coupled to this input impedance for multiplying its value by a multiplication factor. This multiplying circuit comprises a first and a second voltage follower amplifier and a first and a second scaling impedance. The input impedance is coupled between the input of the first voltage follower amplifier and the output of the second voltage follower amplifier with the first and second scaling impedances establishing a voltage division between the output of the first voltage follower amplifier and the input of the second voltage follower amplifier. In this way, the second voltage follower amplifier provides active negative feedback, and effectively multiplies the input impedances's impedance by a factor of one plus the quotient of the second scaling impedance to the first scaling impedance. In this way, the impedance multiplier allows the use of small value, highly accurate resistors, capacitors, and inductors in applications requiring large value, highly accurate resistors, capacitors, and inductors without the cost associated with these large value components. One application is in the design of an extremely low pass filter. This extremely low pass filter comprises a filter capacitor of nominal capacitance, a filter resistor of nominal resistance, and the impedance multiplier circuit. Since the corner frequency of a low pass filter is determined by the inverse of the product of the resistance and capacitance, the larger the resistor, the lower the corner frequency of the filter.

23 Claims, 9 Drawing Sheets

FIG. 13
PRIOR ART

IMPEDANCE MULTIPLIER

FIELD OF THE INVENTION

The invention relates generally to large impedance circuit elements, and more particularly to active circuit element multiplication of nominal impedance values to achieve very large or very small impedances.

BACKGROUND ART

Many electronic circuit applications require large impedances with high levels of precision (e.g., 1% or better). However, large precision resistors having values of resistance greater than 1 M$\Omega$ are not standard and very costly to obtain. Likewise, capacitors in the 100 µF range are very expensive and are typically only precise to 10%. In this range, most capacitors must be electrolytic which introduces problems of leakage and limits the environment in which they may be used. Similarly, inductors with large inductances are heavy and expensive. These large value resistors, capacitors, and inductors are bulky as well as expensive, which exacts a hidden cost in terms of circuit real estate.

An example of an application requiting large, highly precise resistances is the closed loop simulation of mechanical elements under electronic control. Utilizing actual mechanical hardware during development of the electronic controls is often costly and possibly dangerous until the stability of the electronic control has been proven. To reduce the cost and increase the safety and efficiency of the controls development stage of a program, the mechanical hardware itself may be electronically simulated through the use of low pass filters with extremely low corner frequencies.

Many of these mechanical elements, such as servo valves for frequency regulation of aircraft-mounted electric power generators, require these electronic filters to have corner frequencies of only a few millihertz. The RC product must be large to produce a low corner frequency. A large resistance is undesirable because of the cost associated with the precision tolerances required, the bias-current constants on active devices, and the noise-floor limits. Large capacitors simply are not available in tight tolerances, are physically large, and prone to leakage. As a result, the design of such a filter would typically require the use of resistors in the 20–30 M$\Omega$ range. Due to the sensitive nature of electronic controls development, however, the precision of the simulation is critical, and resistors having 1% precision or better are often required. Specifically, corner frequencies of less than 22 mHz may be required to accurately simulate the response of such a servo valve.

Other applications requiring the use of very large, highly accurate resistors to construct low pass filters having corner frequencies in the millihertz range include variable speed constant frequency (VSCF) power conversion systems. In these systems, which typically comprise a variable frequency engine driven generator coupled through a constant frequency electronic power converter to the utilization equipment, a failure in the electronic power conversion stage may result in unwanted DC content in the output waveform. To monitor for and protect against such occurrence, the converter controls must filter out all but the pure DC content of the output waveform. The use of a filter with a corner frequency in the millihertz range ensures that the system is not taken off line unless the output waveform actually contains a precise mount of DC content.

Typically, the construction of these extremely-low pass filters and circuits require that very expensive and bulky precision resistors and large values of capacitance be used. Along with their large size, these large precision resistors and capacitors carry a large price which tends to drive up the total cost of a design. Making room on a circuit board to accommodate these large resistors and capacitors also has a certain cost impact as described above, especially when more or larger boards become necessary. Additionally, the size of the housing may be forced to increase. Large variable precision resistors are also needed in many applications where a dynamic response or dynamic control is required. However, large precise variable resistors or potentiometers are not commonly available, and those that are custom made are relatively expensive.

Figure 1:
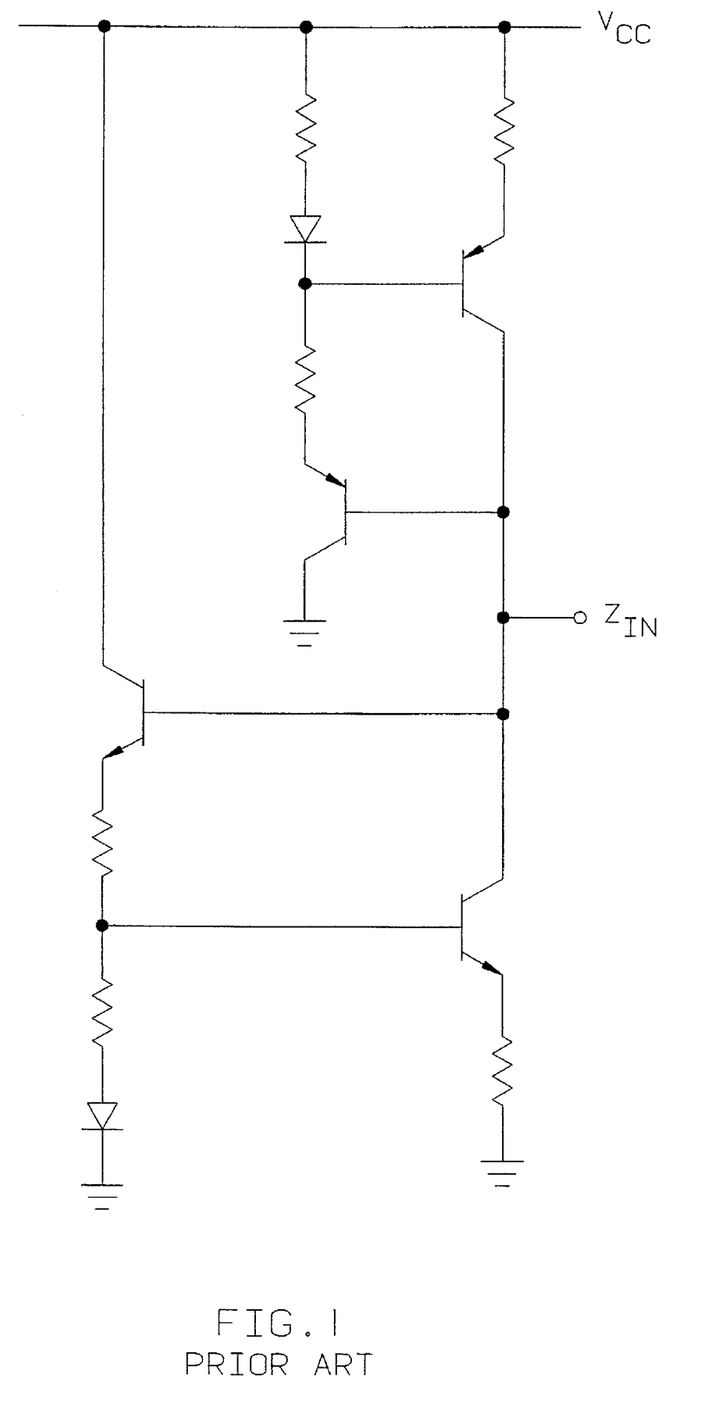
FIG. 1 is an electrical schematic of a typical impedance multiplication circuit.

U.S. Pat. No. 5,124,586, granted Jun. 23, 1992 to Carobolante for an Impedance Multiplier presents one method of multiplying the input resistance of a circuit for use in the construction of integrated circuits. To allow for resistance multiplication for both positive and negative circuit voltages, the circuit of Carobolante (illustrated in FIG. 1) utilizes a complex circuit comprising four transistors, six resistors, and two diodes coupled to a separate voltage supply. This circuit, however, possesses an admired degree of non-linearity which makes it unusable in applications such as those described above. Furthermore, the equivalent circuit of Carobolante is a resistor in series with a dc voltage source, which introduces an unacceptable dc bias requirement. This bias-up aspect of the Carobolante circuit totally precludes its applicability in VSCF applications described above. Additionally, the circuit of Carobolante will not operate to multiply capacitive impedances at all. As such, this circuit is unacceptable for use in applications which require a large value of capacitance, such as timing circuits.

It is a goal, therefore, of the instant invention to overcome these and other problems associated with the use of large value, precision impedances, such as resistors, capacitors, and inductors. Specifically, it is a goal of the instant invention to provide a means of multiplying either the resistance of a resistor, the capacitance of a capacitor, or the inductance of an inductor by either fixed or variable multiplication factors. Further, it is a goal of the instant invention to provide an extremely-low pass filter using readily-available, reasonably-priced, and reasonably-sized components. Also, it is a goal of the instant invention to provide a voltage controlled variable impedance of a large value without inducing unacceptable distortion levels in a processed signal. It is also a goal of the instant invention to improve the linearity and performance of circuits requiring extremely large impedance values.

SUMMARY OF THE INVENTION

In an exemplary embodiment of the instant invention, the impedance multiplier circuit comprises two voltage follower amplifiers, and three impedances of nominal value. The third impedance is coupled between the input of the first voltage follower amplifier and the output of the second voltage follower amplifier, while the first and second scaling impedances are connected to establishing a voltage division between the output of the first voltage follower amplifier and the input of the second voltage follower amplifier. The multiplication factor for this circuit is established by the ratio between the second and first impedances, and is equal to one plus the quotient of the second impedance to the first impedance. At least one of the impedances may be variable to allow the multiplication factor to be varied. In this way, this circuit is capable of multiplying the value of impedance of resistors, capacitors, and inductors.

The circuit of the instant invention may be configured with all three of the impedances being resistors, fixed or variable. For such a configuration the value of the third impedance is multiplied by the scaling factor established by the ratio of the first and second resistors. This configuration allows for resistance multiplication in a very linear fashion.

Alternately, at least one of the impedances may be a capacitor to effectuate a capacitance multiplier circuit. Preferably, the second impedance is chosen to be the capacitor. For this configuration the equivalent circuit is a large value capacitor in series with a very small resistor. Alternately, the third impedance may be a capacitor. For this configuration, it is preferable to have a resistor in parallel with the capacitor because amplifiers currently available do not drive purely capacitive loads with great stability. If this no longer becomes a concern with the amplifier manufactures, this additional parallel coupled resistor may not be needed.

Alternately, at least one of the impedances may be an inductor to effectuate an inductance multiplier circuit. Preferably, the third impedance is chosen to be the inductor.

In an alternate embodiment of the instant invention, the impedance multiplier circuit is utilized in a low pass filter with an ultra-low corner frequency. In this embodiment the invention comprises a filter capacitor, a filter resistor having a value of resistance coupled to the filter capacitor, and the impedance multiplying circuit coupled to the filter resistor for multiplying its value of resistance by a multiplication factor, thereby lowering the corner frequency of the filter. As stated above, the impedance multiplying circuit also allows adjusting of the multiplication factor, thereby adjusting the corner frequency of the filter.

BRIEF DESCRIPTION OF THE DRAWINGS

While the specification concludes with claims particularly pointing out and distinctly claiming that which is regarded as the present invention, the organization, the advantages, and further objects of the invention may be readily ascertained by one skilled in the art from the following detailed description when read in conjunction with the accompanying drawings in which:

DESCRIPTION OF THE PREFERRED EMBODIMENTS

Figure 2:
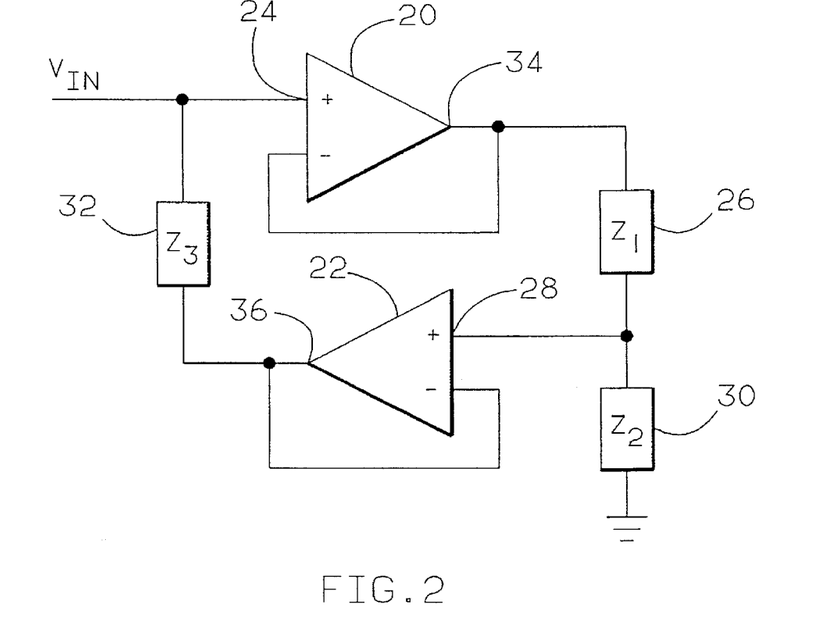
FIG. 2 is an electrical schematic of an impedance multiplier circuit in accordance with an embodiment of the instant invention.

A preferred embodiment of the instant invention, as illustrated in FIG. 2, comprises two operational amplifiers 20 and 22 configured as voltage follower amplifiers. The non-inverting input 24 of amplifier 20 is coupled to an input voltage signal. The output 34 of amplifier 20 is coupled through an impedance 26 to the non-inverting input 28 of amplifier 22. Impedance 30 is also coupled to the non-inverting input 28 and provides a voltage division thereby. The output 36 of amplifier 22 is coupled through impedance 32 to the input 24 of amplifier 20.

In this embodiment, amplifier 20 serves as the main amplifier while amplifier 22 provides active negative feedback. Since both amplifiers 20, 22 are configured as voltage followers, the voltage that appears at their non-inverting inputs 24, 28 also appears at their respective outputs 34, 36. Assuming, as is proper with an operational amplifier, that amplifier 20 has a negligible input current, the current that flows down through impedance 32 is the circuit's input current. The circuit's input impedance is therefore given by the relationship $$Z = V/I \quad (1)$$

To find this value of impedance, the input current must first be determined. By inspection one skilled in the art will see that the input voltage appears at the output 34 of amplifier 20 as stated above with respect to voltage follower amplifiers. Because of voltage division between impedances 26 and 30, the voltage that appears at the non-inverting input 28 of amplifier 22 is given by the relationship $$\frac{Z_2}{Z_1 + Z_2} V \quad (2)$$

where V is the voltage appearing at the output 34 of amplifier 20.

Because amplifier 22 acts like a voltage follower, its output voltage will be equal to its input voltage as given by equation (2). The voltage difference across impedance 32 divided by the impedance 32 produces the input current as follows $$I = \frac{V - \frac{Z_2}{Z_1+Z_2}V}{Z_3} = \frac{\left(1 - \frac{Z_2}{Z_1+Z_2}\right)V}{Z_3} = \frac{\left(\frac{Z_1+Z_2-Z_2}{Z_1+Z_2}\right)V}{Z_3} = \frac{\left(\frac{Z_1}{Z_1+Z_2}\right)V}{Z_3} \quad (3)$$

Substituting equation (3) in equation (1) will lead to an expression for the input impedance of the circuit of FIG. 2 as follows $$Z = \frac{V}{\frac{\left(\frac{Z_1}{Z_1+Z_2}\right)V}{Z_3}} = \left(1 + \frac{Z_2}{Z_1}\right)Z_3 \quad (4)$$

Hence the impedance 32 is multiplied by a gain coefficient or multiplication factor of $(1+Z_2/Z_1)$.

Figure 3:
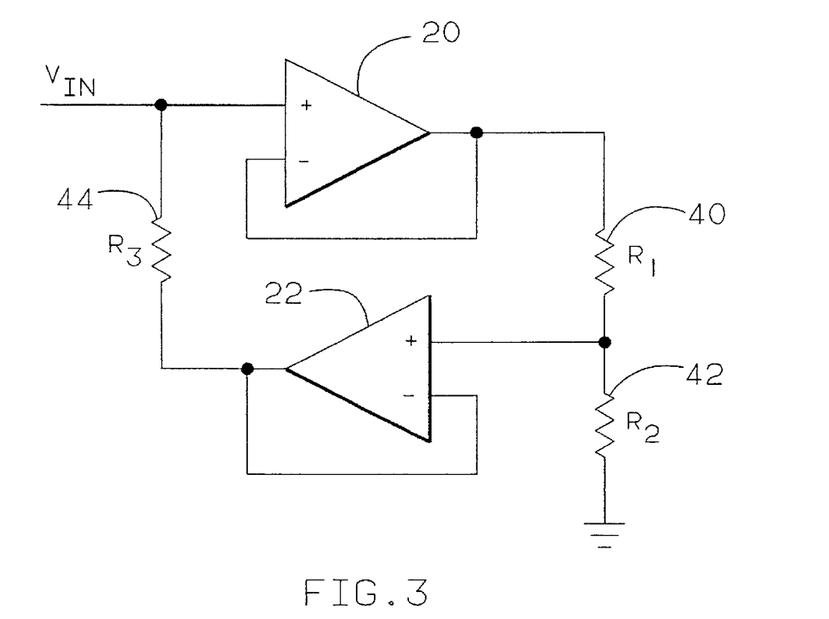
FIG. 3 is an electrical schematic of an impedance multiplier circuit multiplying the value of resistance of a resistor in accordance with an embodiment of the instant invention.

In a preferred embodiment of the instant invention as illustrated in FIG. 3, the impedances are illustrated as resistors 40, 42, and 44. For this embodiment, the resistance of resistor 44 will be multiplied by the multiplication factor $(1+R_2/R_1)$. As an example, assume that resistor 44 has a resistance of 332 kΩ and resistor 40 and 42 have resistances of 1 kΩ and 100 kΩ respectively. Substituting these values into equation (4) above results in a value of 33.5 MΩ. As may be recognized, this circuit appears as a fourth resistance having a value of 33.5 MΩ. If precision values (e.g. ±1%) are used for the three resistors 40, 42, and 44, the resultant fourth resistance will have a tolerance of slightly less than ±3%. In this way, an extremely precise value of resistance can be achieved.

Figure 4:
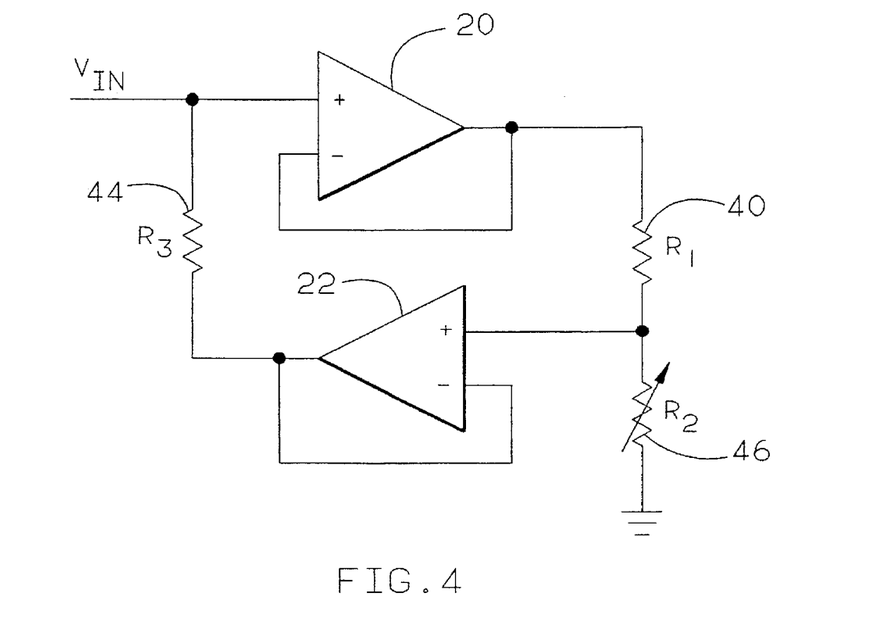
FIG. 4 is an electrical schematic of an impedance multiplier circuit multiplying the value of resistance of a resistor by a variable multiplication scale factor in accordance with an embodiment of the instant invention.
Figure 5:
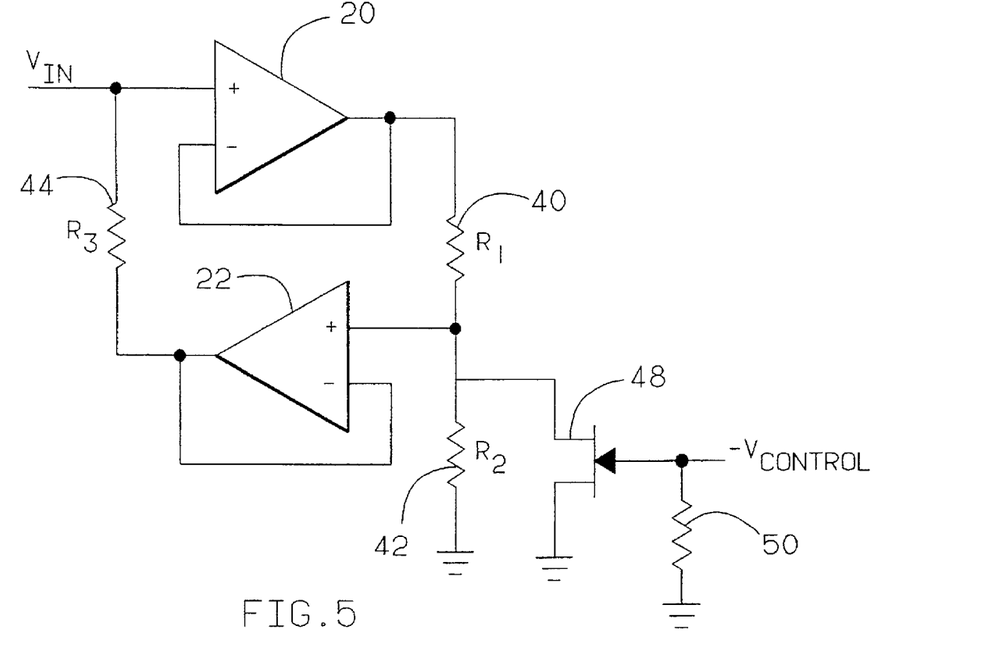
FIG. 5 is an electrical schematic of an impedance multiplier circuit multiplying the value of resistance of a resistor by a voltage controlled variable scale factor in accordance with an embodiment of the instant invention.
Figure 5A:
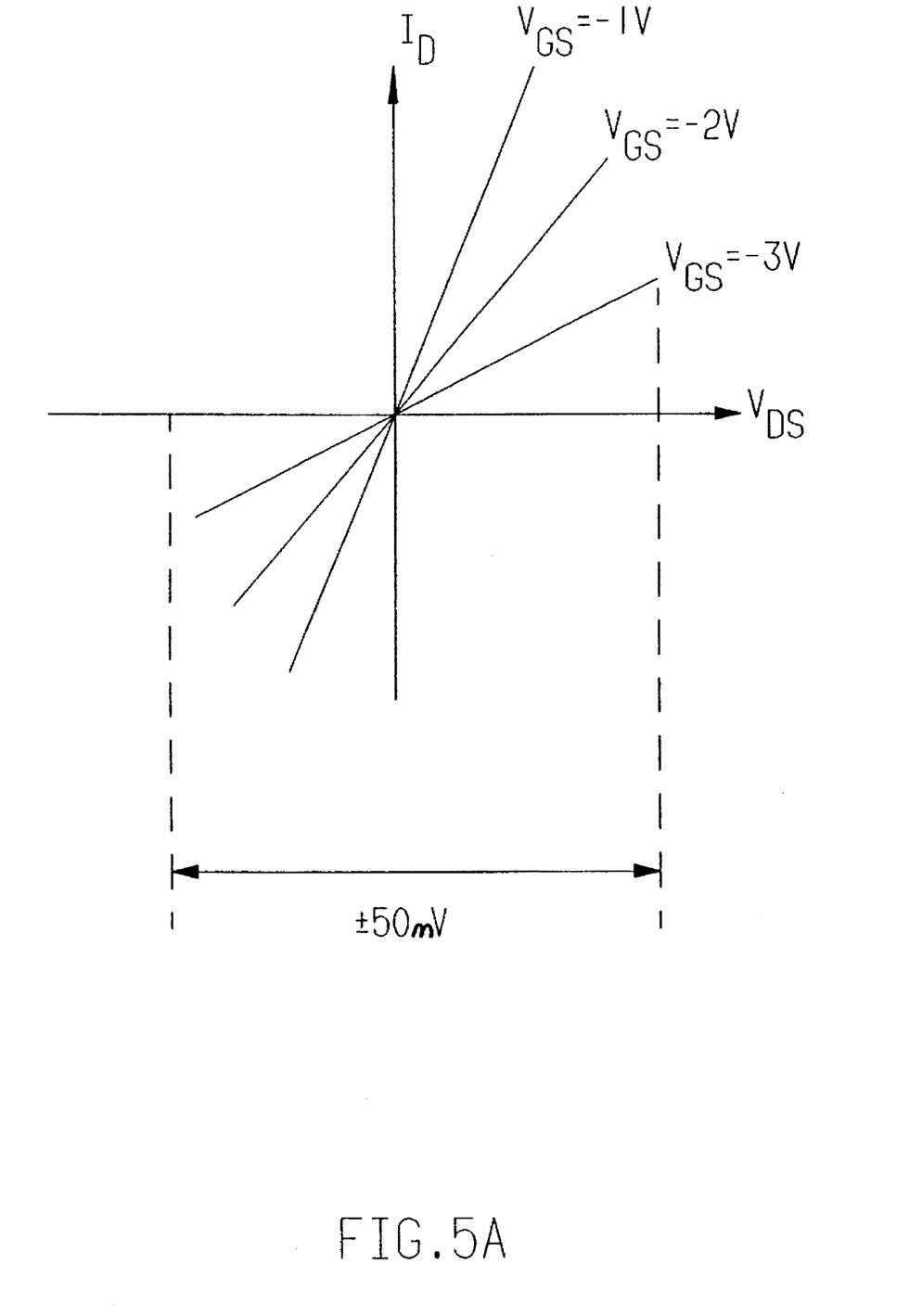
FIG. 5A. is a voltage-current characteristic for a junction field effect transistor applicable to an embodiment of the instant invention as illustrated in FIG. 5.

If, as illustrated in an alternate embodiment in FIG. 4, one of the resistors is replaced by a variable resistor 46, the gain or multiplication factor becomes variable as well (see Equation (4)). As will be recognized by one skilled in the art, any of the resistors may be made variable to accomplish a variable fourth resistance value. Besides the use of variable resistors or potentiometers illustrated in FIG. 4, a voltage-controlled resistance may be used as illustrated in FIG. 5 to accomplish a similar goal. As illustrated in this embodiment, a junction field effect transistor (FET) 48 provides a parallel resistance path with one of the resistors 42 of the circuit. This FET is used as a voltage-variable resistance. Its resistance is controlled by a negative gate-to-source dc bias voltage. Resistor 50 is used to reference the FET's gate (input) terminal to ground. The V-I characteristics for the FET are illustrated in FIG. 5A. As will be recognized by one skilled in the art, the greater slope of the V-I characteristic as the gate to source voltage is varied corresponds to less resistance. As will also be recognized, when a FET is used as a voltage variable resistance, it will exhibit a high-degree of non-linearity if the drain-to-source voltage becomes too large. If this voltage is held within a given range around the origin, however, the linearity of the FET's variable resistance is approximately linear.

The embodiment of FIG. 5 offers several advantages. The voltage levels across the FET's drain-to-source are reduced which, as stated above, improves linearity. Also, the dynamic resistance of the FET is multiplied. For example, if $R_1$ and $R_2$ are both equal to 100 kΩ, the drain-to-source voltage is reduced by more than 50%, while the dynamic resistance range is doubled.

Figure 6:
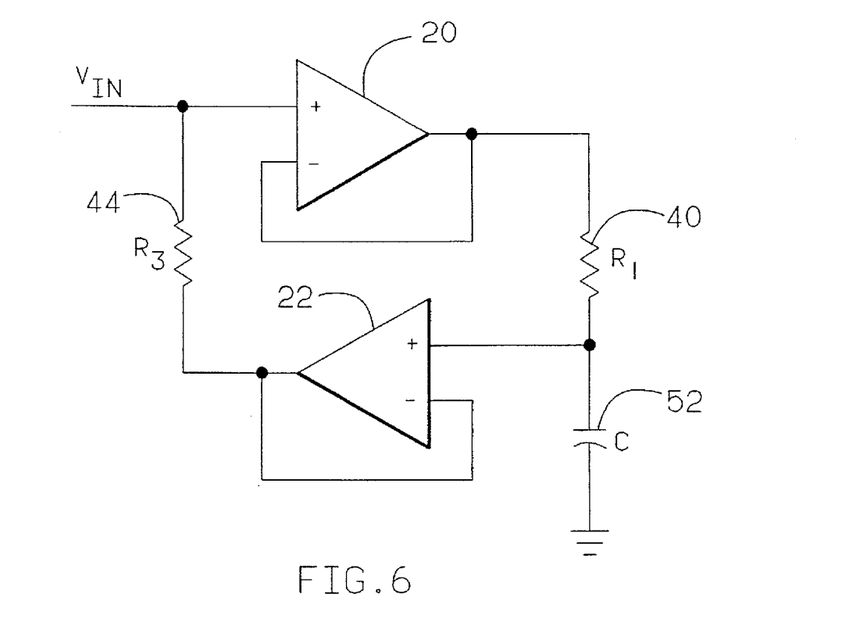
FIG. 6 is an electrical schematic of an impedance multiplier circuit multiplying the value of capacitance of a capacitor in accordance with an embodiment of the instant invention.

In another preferred embodiment, as illustrated in FIG. 6, one of the impedances may be a capacitor 52. With a capacitor 52 in the circuit, the value of impedance for $Z_2$ to be used in Equation (4) is 1/sC as follows $$Z = R_3\left(1 + \frac{\frac{1}{sC}}{R_1}\right) = R_3\left(1 + \frac{1}{sR_1C}\right) = \quad (5)$$

$$R_3 + \frac{R_3}{sR_1C} = R_3 + \frac{1}{s\left(\frac{R_1}{R_3}\right)C}$$

Figure 7:
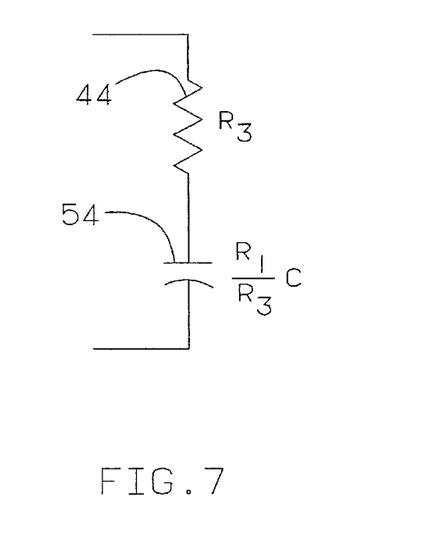
FIG. 7 is an electrical schematic of an equivalent circuit of the embodiment of FIG. 6.

Therefore, the resultant fourth impedance (see FIG. 7) is equal to the value of resistance of resistor 44 in series with the value of capacitance of capacitor 52 multiplied by $R_1/R_3$. As the resistance of resistor 44 is decreased, the value of resistance of the resultant fourth impedance decreased while the value of capacitance 54 increases. This a desirable situation when it is desired to have a very large capacitance with a very small series resistance.

Figure 8:
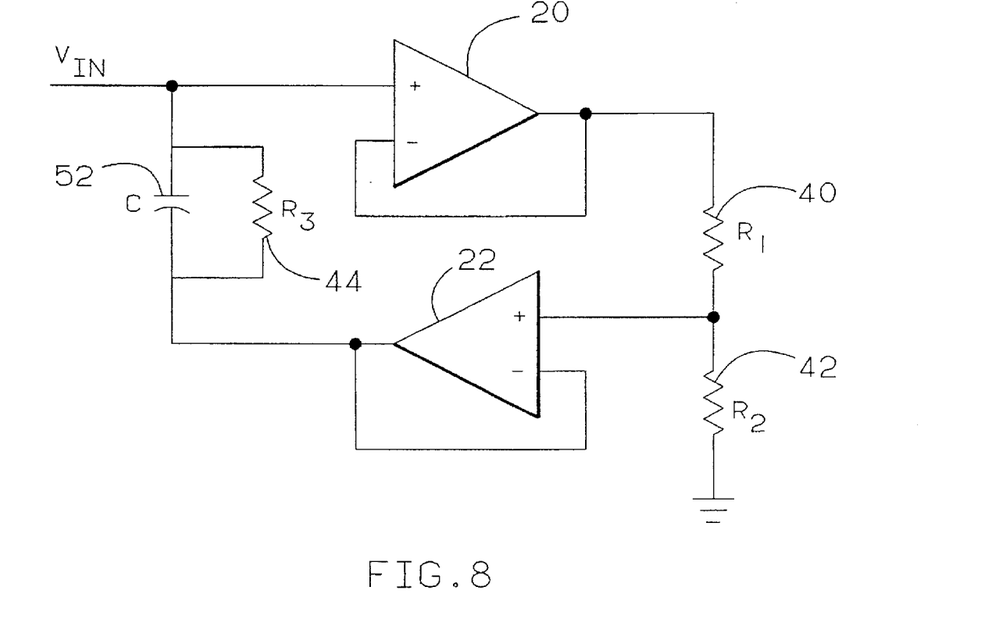
FIG. 8 is an electrical schematic of an impedance multiplier circuit multiplying the value of impedance of a capacitor in accordance with an alternate embodiment of the instant invention.

As illustrated in FIG. 8, an alternate to the circuit illustrated in FIG. 6 places the capacitor 52 in parallel with resistor 44 to achieve an impedance multiplication. With this circuit, the impedance of capacitor 52 is multiplied by the multiplication factor along with the resistance of resistor 44. If a large value is chosen for resistor 44 (e.g. 1 MΩ), the resultant fourth impedance will be a very small precision capacitor in parallel with a tremendously large value resistor (on the order of 100 MΩ). This tremendously large value of impedance will adequately approximate an open circuit in most applications. This circuit, in other words, has the effect of canceling out the capacitance. The equivalent circuit, therefore, is a fourth impedance approximately equal to an open circuit. The resistor 44 is required because of present limitations of operational amplifiers driving capacitive loads and to provide some dc bias for the operational amplifier's input. Resistor 44 will not be needed if this limitation is resolved.

Figure 9:
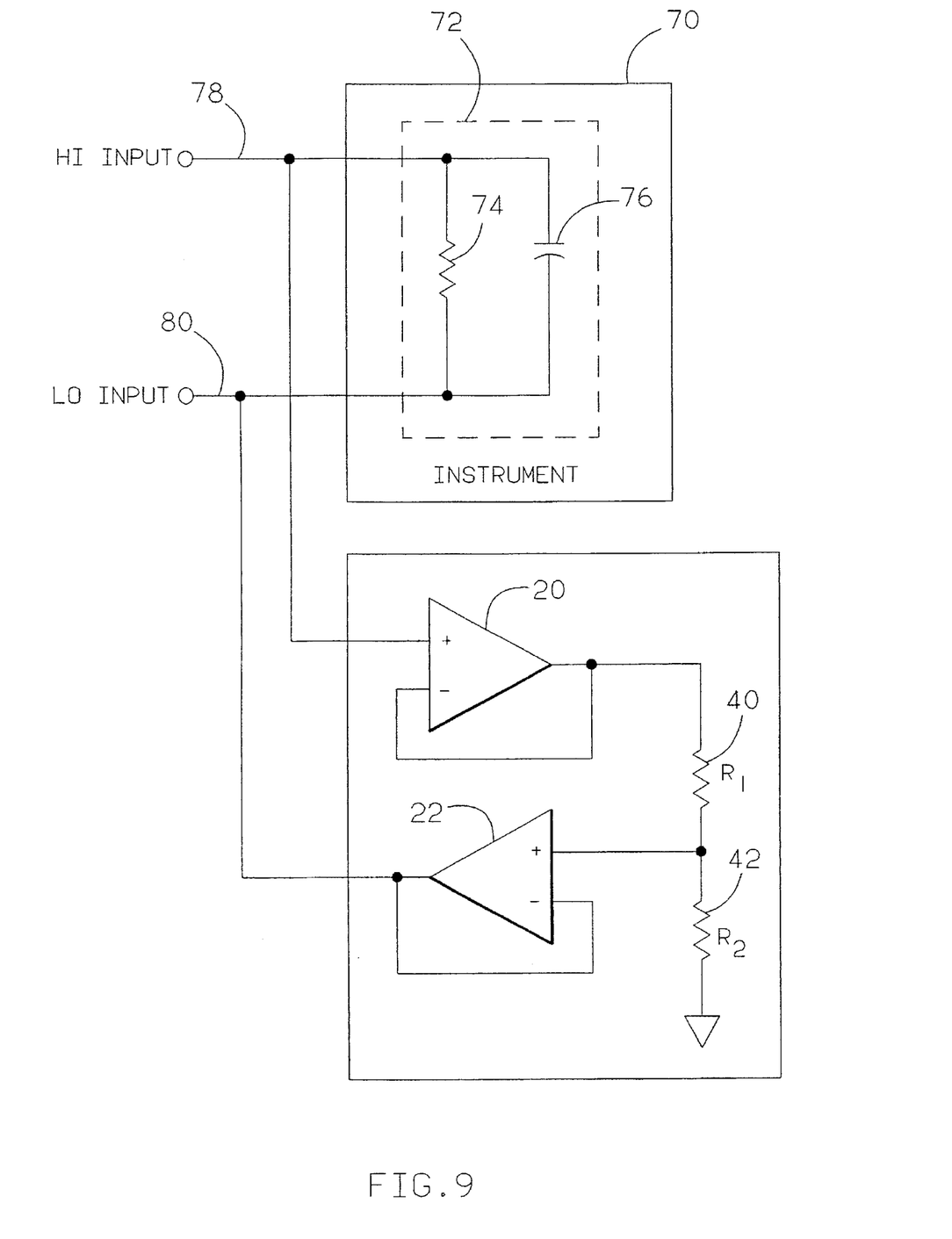
FIG. 9 is an electrical schematic of the impedance multiplier circuit of FIG. 8 used in accordance with an embodiment of the invention.

An application of this embodiment is illustrated in FIG. 9. Measurement instruments 70, such as oscilloscopes and digital multimeters, typically have equivalent input circuits 72 which may be represented by a resistance 74 in parallel with a capacitance 76. This input shunt capacitance 76 limits the accuracy of the measurement instrument 70 since it forms a low pass filter. Recognizing the advantages of the embodiment illustrated in FIG. 8, the impedance multiplier circuit can be coupled to the input terminals 78, 80 of the measurement instrument 70. By so connecting the impedance multiplier circuit of FIG. 8, the effective shunt capacitance is lowered, the effective shunt resistance is raised, and the resulting frequency response of the measurement instrument 70 is extended. This configuration of the instant invention has great commercial implications. It will also be recognized by one skilled in the art that this configuration may also be used to cancel cable capacitance which is another problem in the art.

Figure 10:
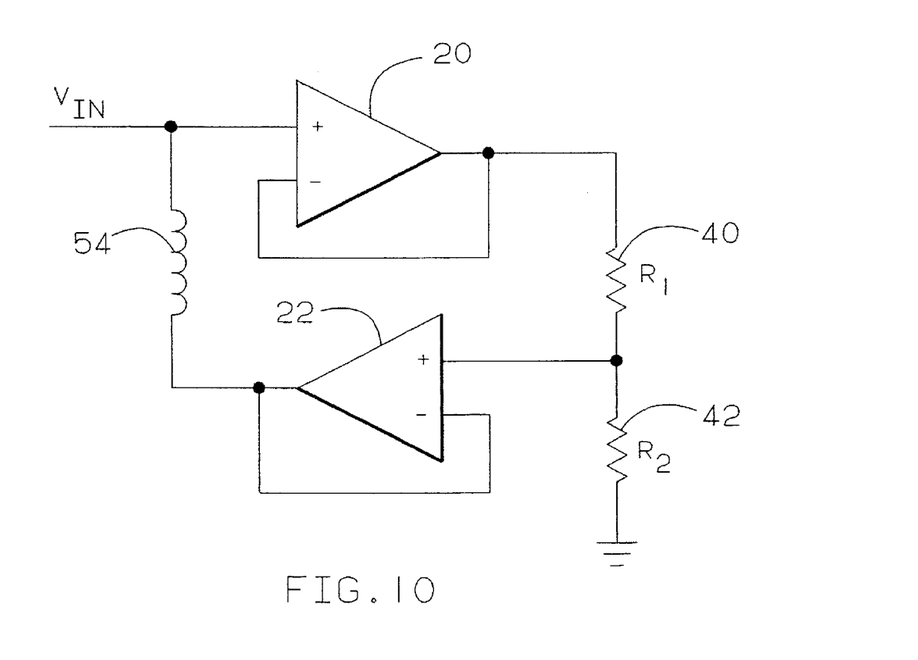
FIG. 10 is an electrical schematic of an impedance multiplier circuit multiplying the value of inductance of an inductor in accordance with an embodiment of the instant invention.
Figure 11:
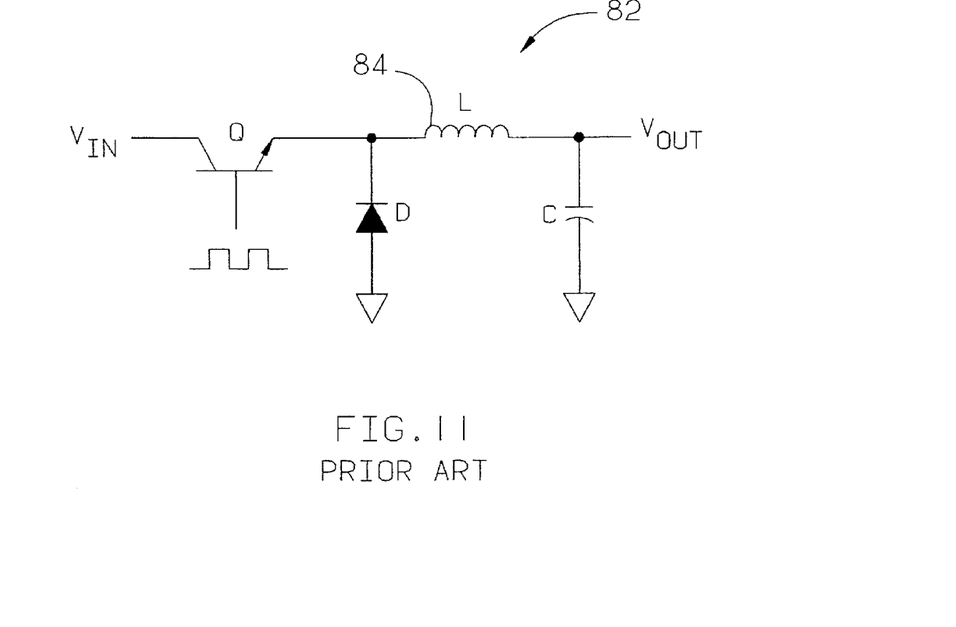
FIG. 11 is an electrical schematic of a typical step-down switching regulator.
Figure 12:
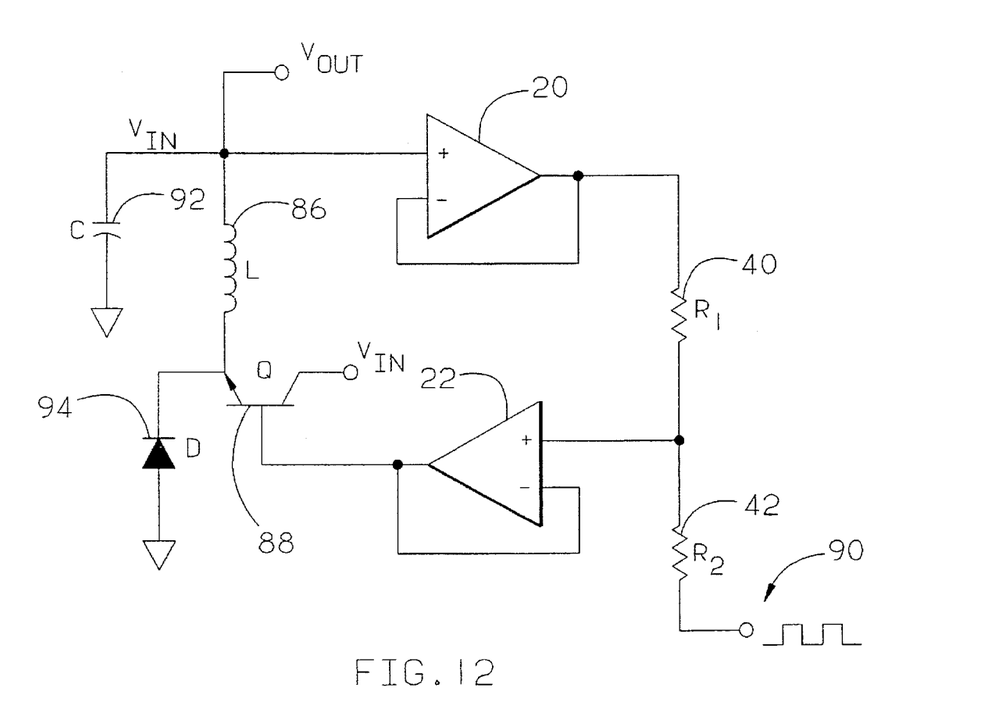
FIG. 12 is an electrical schematic of a step-down switching regulator constructed in accordance with an embodiment of the instant invention utilizing the impedance multiplier circuit of FIG. 10

An alternate preferred embodiment is illustrated in FIG. 10. In this embodiment, an inductor 54 is utilized as the impedance to be multiplied by the factor derived in Equation (4). As will be apparent from the above discussion, the equivalent circuit for this configuration is an inductor having an inductance equal to the inductance of inductor 54 multiplied by the multiplication factor $(1+R_2/R_1)$. This configuration of the impedance multiplier of the instant invention has significant application to the design of step-down switching regulators. As illustrated in FIG. 11, a typical step-down switching regulator 82 requires a large filter inductance 84 in series with the output to help smooth the regulated waveform. Utilizing the impedance multiplication circuit as configured in FIG. 10 to multiply the inductance of the circuit permits the use of a small inductance, high current inductor 86 as illustrated in FIG. 12. This embodiment interposes the controlled switch 88 in series with the inductor 86, and applies the switching control signal 90 to a terminal of the second impedance 42. The filter capacitor 92 is coupled across the inductor 86 to ground. The flyback diode 94 is coupled between ground and the inductor 86 to allow flyback current flow when the switch 88 is turned off.

Figure 13:
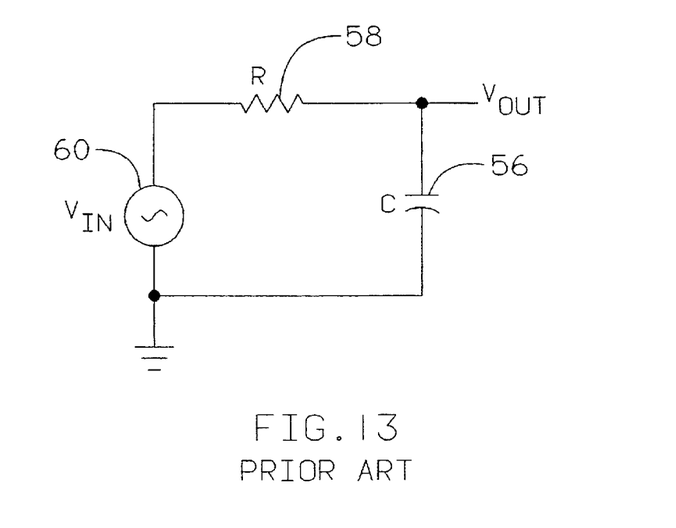
FIG. 13 is an electrical schematic of a typical low pass filter.

Each of the above embodiments may be used as appropriate in circuits which require large value impedances, but which do not want to sacrifice precision, cost, and physical size which these large value impedances typically require. As mentioned above, one such application is in the construction of a low pass filter with an extremely low corner frequency. A typical low pass filter construction is illustrated in FIG. 13. To achieve a corner frequency in the 25 mHz range, such a typically construction would require the use of, for example, a 1 MΩ resistor 58 and a capacitor 56 having a capacitance of 6.2 µF. However, such a capacitor is too large for many applications. Besides being too large, capacitors of this size typically have tolerances in the ±10% range. Additionally, in order to get such a high capacitance, these capacitors are typically electrolytic which may be undesirable in many applications because of the potential for leakage. The cost of such a capacitor 56 is also significantly high to render its use undesirable.

Figure 14:
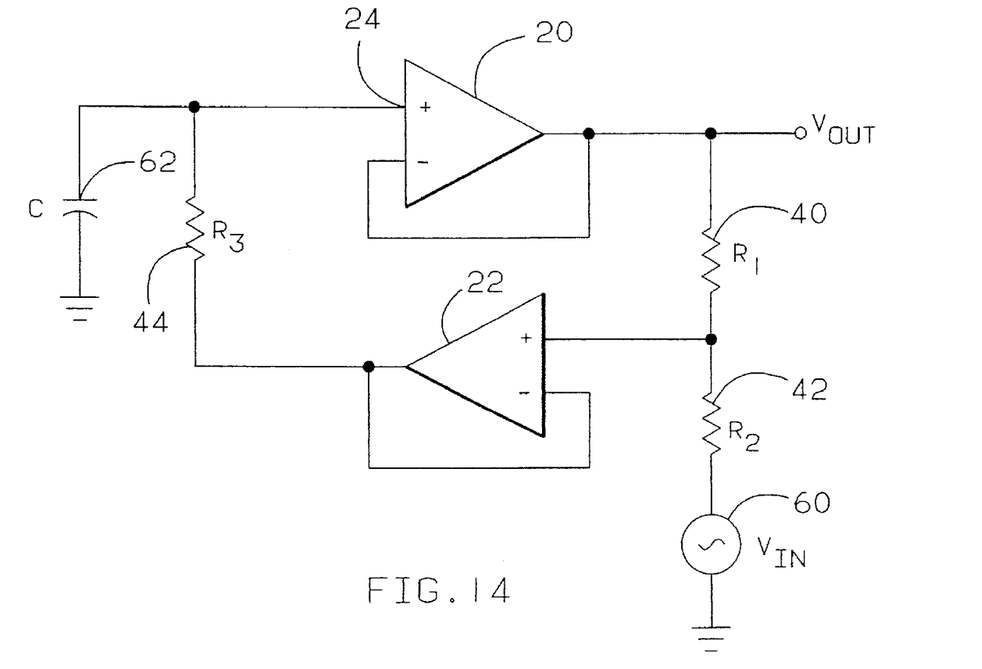
FIG. 14 is an electrical schematic of a low pass filter with an extremely low corner frequency constructed in accordance with an embodiment of the instant invention.

The preferred embodiment illustrated in FIG. 14, however, uses only nominal value impedances having acceptable precision. Specifically, the extremely low corner frequency low pass filter of FIG. 14 comprises the impedance multiplier circuit as described above with the addition of a capacitor 62 coupled to the non-inverting input 24 of amplifier 20. The signal to be filtered is coupled to resistor 42. Utilizing values for resistance for resistor 40 of 1 kΩ, for resistor 42 of 100 kΩ, and for resistor 44 of 332 kΩ, and a standard nominally sized, precise, inexpensive capacitor 62 having a value of capacitance of only 0.22 µF can be used to achieve a filter with a corner frequency of 21.6 mHz. One skilled in the art will recognize that, as described above, the various impedances may be varied to achieve a filter with a means of lowering and raising its corner frequency.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. The details of the structure may be varied substantially without departing from the spirit of the invention, and the exclusive use of all modifications which come within the scope of the appended claims is reserved.

I claim:

1. An electronic circuit, comprising:

a first and a second voltage follower amplifier, each having an input and an output;

a first impedance coupled between said output of said first amplifier and said input of said second amplifier;

a second impedance coupled between said input of said second amplifier and a circuit common point;

a third impedance coupled between said output of said second amplifier and said input of said first amplifier; and wherein said second amplifier provides active negative feedback to said first amplifier whereby the circuit appears at said input to said first amplifier as a fourth impedance having a value of impedance equal to said third impedance multiplied by a multiplication factor equal to unity plus a ratio of said second impedance to said first impedance.

2. The circuit of claim 1, wherein at least one of said first, said second, and said third impedance has a value of impedance which is variable, said fourth impedance having a value of impedance which is variable thereby.

3. The circuit of claim 1, wherein said first impedance is a resistor having a first value of resistance, said second impedance is a resistor having a second value of resistance, said third impedance is a resistor having a third value of resistance, and wherein said fourth impedance is a resistor having a fourth value of resistance.

4. The circuit of claim 3, further comprising means for varying at least one of said first and said second values of resistance, said multiplication factor being varied thereby.

5. The circuit of claim 4, wherein said means for varying at least one of said first and second values of resistance comprises a voltage-controlled resistance coupled to one of said at least one of said first and second values of resistance, whereby said value of resistance of one of said first and said second resistors is varied by a value of control voltage applied thereto by an external controller.

6. The circuit of claim 5, wherein said voltage-controlled resistance comprises a junction field effect transistor.

7. The circuit of claim 3, wherein at least one of said first, said second, and said third resistors is a variable resistor, said fourth resistor being variable thereby.

8. The circuit of claim 3 having an external source of electrical energy interposed between said second resistor and said circuit common point, further comprising a capacitor having a value of capacitance coupled between said input of said first amplifier and said circuit common point whereby the circuit operates to filter the output of an external source of electrical energy interposed between said resistor and said circuit common point, the circuit having a corner frequency determined by said value of capacitance and said forth value of resistance.

9. The circuit of claim 8, wherein said corner frequency is inversely related to said ratio of said second resistance to said first resistance.

10. The circuit of claim 1, wherein at least one of said first, said second, and said third impedances is a capacitor.

11. The circuit of claim 1, wherein said second impedance is a capacitor.

12. The circuit of claim 1, wherein said third impedance is a capacitor.

13. The circuit of claim 12, further comprising a fifth resistor coupled in parallel with said capacitor.

14. The circuit of claim 1, wherein at least one of said first, said second, and said third impedances is an inductor.

15. The circuit of claim 1, wherein said third impedance is an inductor.

16. An electronic filter, comprising:

a filter capacitor;

a filter resistor having a value of resistance coupled to said filter capacitor;

means coupled to said filter resistor for lowering a corner frequency of the filter; and wherein said means for lowering said corner frequency comprises means for multiplying said value of resistance by a multiplication factor; and wherein said means for multiplying comprises a first and a second voltage follower amplifier, each having an input and an output, and a first and a second scaling resistor, said filter resistor being coupled between said input of said first voltage follower amplifier and said output of said second voltage follower amplifier, said first and said second scaling resistors establishing a voltage division between said output of said first voltage follower amplifier and said input of said second voltage follower amplifier.

17. The filter of claim 16, wherein said multiplication factor is established by said first and said second scaling resistors.

18. The filter of claim 16, wherein said multiplication factor is equal to one plus the quotient of said second scaling resistor to said first scaling resistor.

19. An electronic filter, comprising:

a filter capacitor;

a filter resistor having a value of resistance coupled to said filter capacitor;

means coupled to said filter resistor for lowering a corner frequency of the filter; and wherein said means for lowering said corner frequency comprises means for multiplying said value of resistance by a multiplication factor; and wherein said means for multiplying comprises a first and a second scaling resistor, and wherein said multiplication factor is established by a ratio between said first and said second scaling resistor; and wherein said means for multiplying further comprises a first and a second voltage follower amplifier each having an input and an output, and wherein said filter resistor is coupled between said input of said first voltage follower amplifier and said output of said second voltage follower amplifier, and wherein said first scaling resistor is coupled between said output of said first voltage follower amplifier and said input of said second voltage follower amplifier, and wherein said second scaling resistor is coupled between said input of said second voltage follower amplifier and a signal source input.

20. An electronic filter, comprising:

a filter capacitor;

a filter resistor having a value of resistance coupled to said filter capacitor;

means coupled to said filter resistor for lowering a corner frequency of the filter; and wherein said means for lowering said corner frequency comprises means for multiplying said value of resistance by a multiplication factor; and wherein said means for multiplying comprises a first voltage follower amplifier utilizing active negative feedback, and wherein said filter resistor is coupled in series with said active negative feedback.

21. An electronic filter, comprising:

a filter capacitor;

a filter resistor having a value of resistance coupled to said filter capacitor;

means coupled to said filter resistor for lowering a corner frequency of the filter; and wherein said means for lowering said corner frequency comprises means for multiplying said value of resistance by a multiplication factor; and wherein said means for multiplying comprises a first voltage follower amplifier utilizing active negative feedback, and wherein said filter resistor is coupled in series with said active negative feedback; and wherein said active negative feedback is produced by a first and a second scaling resistor and a second voltage follower amplifier, said first scaling resistor coupling an output of said first voltage follower amplifier to an input of said second voltage follower amplifier, said second scaling resistor coupled to said input of said second voltage follower amplifier and a signal source input, and wherein an output of said second voltage follower resistor is coupled through said filter resistor to an input of said first voltage follower amplifier.

22. A step-down switching regulator, comprising:

a first and a second voltage follower amplifier, each having an input and an output;

a first resistor coupled between said output of said first amplifier and said input of said second amplifier;

a second resistor coupled to said input of said second amplifier and to an external source of switching pulses;

a controlled switch having an input coupled to an external source of a signal to be regulated, an output, and a control terminal coupled to said output of said second amplifier;

an inductor coupled to said input of said first amplifier and to said output of said controlled switch; and a filter capacitor coupled between said input of said first amplifier and a circuit common point; and wherein said input of said first amplifier forms an output terminal for the step-down switching regulator.

23. A circuit for multiplying the value of an impedance to be multiplied, comprising:

a first and a second voltage follower amplifier each having an input and an output;

a first resistor coupled between said output of said first amplifier and said input of said second amplifier;

a second resistor coupled between said input of said second amplifier and a circuit common point; and wherein the impedance to be multiplied is coupled between said output of said second amplifier and said input of said first amplifier; and wherein said second amplifier provides active negative feedback to said first amplifier whereby the circuit multiplies the impedance to be multiplied by a multiplication factor equal to unity plus a ratio of said second resistor to said first resistor.

* * * * *